United States Patent
Webster et al.

(10) Patent No.: US 7,059,040 B1
(45) Date of Patent: Jun. 13, 2006

(54) OPTICAL MODULE WITH LENS INTEGRAL HOLDER FABRICATION METHOD

(75) Inventors: Steven Webster, Chandler, AZ (US); Thomas P. Glenn, Gilbert, AZ (US); Roy Dale Hollaway, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 791 days.

(21) Appl. No.: 09/764,196

(22) Filed: Jan. 16, 2001

(51) Int. Cl.
*H05K 3/20* (2006.01)

(52) U.S. Cl. .............................. 29/831; 29/832; 29/841; 29/411

(58) Field of Classification Search ................... 29/831, 29/832, 841, 411, 412, 415; 250/216, 239, 250/214.1; 257/80, 81–84, 432–434; 359/819
See application file for complete search history.

(56) References Cited

U.S. PATENT DOCUMENTS

| | | | |
|---|---|---|---|
| 3,018,689 A | 1/1962 | Saxe | 359/739 |
| 3,880,528 A | 4/1975 | Petersen et al. | 356/225 |
| 4,055,761 A | 10/1977 | Shimomura | 250/239 |
| 4,293,190 A | 10/1981 | Clover | |
| 4,390,220 A | 6/1983 | Benasutti | |
| 4,433,886 A | 2/1984 | Cassarly et al. | |
| 4,491,865 A | 1/1985 | Danna et al. | 358/98 |
| 4,744,009 A | 5/1988 | Grabbe et al. | 361/398 |
| 4,801,998 A | 1/1989 | Okuaki | |
| 4,843,313 A | 6/1989 | Walton | 324/158 |
| 4,896,217 A | 1/1990 | Miyazawa et al. | 358/213.11 |
| 4,956,546 A * | 9/1990 | Nishibe et al. | 250/203.1 |
| 4,971,930 A | 11/1990 | Fusaroli et al. | |
| 4,980,635 A | 12/1990 | Walton et al. | 324/158 |
| 4,999,142 A | 3/1991 | Fukushima et al. | 264/1.7 |
| 5,001,315 A | 3/1991 | Runyan et al. | 200/307 |
| 5,023,442 A | 6/1991 | Taniguchi et al. | 250/208.1 |
| 5,068,713 A | 11/1991 | Toda | 357/72 |
| 5,122,861 A | 6/1992 | Tamura et al. | 357/74 |
| 5,220,198 A | 6/1993 | Tsuji | 257/731 |
| 5,228,430 A * | 7/1993 | Sakamoto | 600/134 |
| 5,274,456 A | 12/1993 | Izumi et al. | 358/209 |
| 5,365,101 A | 11/1994 | Tonai | 257/434 |
| 5,383,034 A | 1/1995 | Imamura et al. | 358/474 |
| 5,400,072 A | 3/1995 | Izumi et al. | 348/335 |
| 5,412,229 A | 5/1995 | Kuhara et al. | 257/183 |
| 5,424,531 A * | 6/1995 | O'Regan et al. | 250/216 |
| 5,434,682 A | 7/1995 | Imamura et al. | 358/474 |
| 5,436,492 A | 7/1995 | Yamanaka | 257/433 |
| 5,444,520 A | 8/1995 | Murano | 355/229 |

(Continued)

FOREIGN PATENT DOCUMENTS

GB          1022329          3/1966

(Continued)

*Primary Examiner*—Timothy V. Eley
(74) *Attorney, Agent, or Firm*—Gunnison, McKay & Hodgson, L.L.P.; Serge J. Hodgson

(57) ABSTRACT

A method of forming an optical module includes mounting an image sensor to a base of a substrate and bonding a lens housing to a sidewall of the substrate. A mounting surface of the lens housing includes a locking feature having a horizontal surface and a vertical surface. The sidewall of the substrate includes a joint surface. To bond the lens housing to the sidewall of the substrate, a bond is formed between the horizontal surface of the locking feature of the lens housing and the joint surface of the sidewall. Further, a bond is formed between the vertical surface of the locking feature of the lens housing and an interior surface of the sidewall.

34 Claims, 9 Drawing Sheets

U.S. PATENT DOCUMENTS

| | | | |
|---|---|---|---|
| 5,463,229 A | 10/1995 | Takase et al. | 257/59 |
| 5,489,995 A | 2/1996 | Iso et al. | 358/483 |
| 5,523,608 A | 6/1996 | Kitaoka et al. | 257/433 |
| 5,570,204 A | 10/1996 | Kumashiro | 358/471 |
| 5,579,164 A | 11/1996 | Chapnik | 359/618 |
| 5,581,094 A | 12/1996 | Hara et al. | 257/80 |
| 5,590,787 A | 1/1997 | Hodges | 206/724 |
| 5,604,362 A | 2/1997 | Jedlicka et al. | 257/233 |
| 5,617,131 A | 4/1997 | Murano et al. | 347/233 |
| 5,655,189 A | 8/1997 | Murano | 399/220 |
| 5,672,902 A | 9/1997 | Hatanaka et al. | 257/431 |
| 5,783,815 A | 7/1998 | Ikeda | 250/208.1 |
| 5,804,827 A | 9/1998 | Akagawa et al. | 250/370.06 |
| 5,811,799 A | 9/1998 | Wu | 250/239 |
| 5,821,532 A * | 10/1998 | Beaman et al. | 250/239 |
| 5,825,560 A | 10/1998 | Ogura et al. | 359/822 |
| 5,861,654 A | 1/1999 | Johnson | 257/433 |
| 5,867,368 A | 2/1999 | Glenn | 361/783 |
| 5,902,993 A | 5/1999 | Okushiba et al. | 250/208.1 |
| 5,932,875 A | 8/1999 | Chung et al. | 250/239 |
| 5,998,878 A | 12/1999 | Johnson | 257/797 |
| 6,011,294 A | 1/2000 | Wetzel | 257/434 |
| 6,011,661 A | 1/2000 | Weng | 359/819 |
| 6,020,582 A | 2/2000 | Bawolek et al. | 250/208.1 |
| 6,037,655 A | 3/2000 | Philbrick et al. | 257/680 |
| 6,060,722 A | 5/2000 | Havens et al. | 250/566 |
| 6,072,232 A | 6/2000 | Li et al. | 257/680 |
| 6,122,009 A | 9/2000 | Ueda | 348/335 |
| 6,130,448 A | 10/2000 | Bauer et al. | 257/222 |
| 6,134,393 A * | 10/2000 | Melman | 396/429 |
| 6,147,389 A | 11/2000 | Stern et al. | 257/434 |
| 6,153,927 A | 11/2000 | Raj et al. | 257/680 |
| 6,184,514 B1 | 2/2001 | Rezende et al. | 250/208.1 |
| 6,266,197 B1 * | 7/2001 | Glenn et al. | 359/819 |
| 6,384,397 B1 | 5/2002 | Takiar et al. | 250/208.1 |
| 6,384,472 B1 | 5/2002 | Huang | 257/680 |
| 6,392,703 B1 | 5/2002 | Uchino et al. | 348/373 |
| 6,396,116 B1 * | 5/2002 | Kelly et al. | 257/432 |
| 6,498,624 B1 | 12/2002 | Ogura et al. | 348/335 |
| 6,518,656 B1 | 2/2003 | Nakayama et al. | 257/680 |
| 6,627,864 B1 | 9/2003 | Glenn et al. | 250/208.1 |
| 6,627,872 B1 | 9/2003 | FuKamura et al. | 250/239 |
| 6,727,431 B1 * | 4/2004 | Hashimoto | 174/52.2 |
| 6,762,796 B1 | 7/2004 | Nakajoh et al. | 348/340 |
| 6,767,753 B1 | 7/2004 | Huang | 438/25 |
| 6,867,438 B1 | 3/2005 | Maruyama et al. | 257/184 |
| 2003/0137595 A1 | 7/2003 | Takachi | 348/340 |

FOREIGN PATENT DOCUMENTS

| | | |
|---|---|---|
| GB | 2 146 504 | 4/1985 |
| JP | 59-228755 | 12/1984 |
| JP | 62-224047 | 10/1987 |
| JP | 09-021938 | 1/1997 |
| JP | 09-232548 | 9/1997 |
| JP | 10-302587 | 11/1998 |
| WO | WO 93/22787 | 11/1993 |
| WO | WO 00/038103 | 6/2000 |
| WO | WO 03/019660 | 3/2003 |

* cited by examiner

OPTICAL MODULE WITH LENS INTEGRAL HOLDER FABRICATION METHOD

BACKGROUND OF THE INVENTION

1. Field of the Invention

The present invention relates generally to the packaging of electronic components. More particularly, the present invention relates to a method for fabricating an optical module.

2. Description of the Related Art

Image sensors are well known to those of skill in the art. An image sensor included an active area, which was responsive to electromagnetic radiation. The image sensor was used to fabricate an image sensor assembly.

In one prior art image sensor assembly, the image sensor was located within a housing, which supported a window. Radiation passed through the window and struck the active area of the image sensor, which responded to the radiation.

To form the image sensor assembly, the image sensor was mounted to a printed circuit mother board. After the image sensor was mounted, a housing was mounted around the image sensor and to the printed circuit mother board. This housing provided a seal around the image sensor, while at the same time, supported a window above the image sensor.

As the art moves to smaller and lighter weight electronic devices, it becomes increasingly important that the size of the image sensor assembly used within these electronic devices is small. The conventional image sensor assembly described above required a housing to support the window and to seal the image sensor. However, this housing was relatively bulky and, as a result, the image sensor assembly was relatively large.

SUMMARY OF THE INVENTION

In accordance with the present invention, an optical module includes a substrate having a base and a sidewall. The optical module further includes an image sensor coupled to the base and a lens housing coupled to the sidewall.

The sidewall includes a joint surface and the lens housing includes a mounting surface. The mounting surface of the lens housing is coupled to the joint surface of the substrate thus coupling the lens housing to the sidewall.

In one embodiment, the mounting surface and the joint surface are planar and are bonded together with adhesive as a butt bond. The mounting surface has a width sufficient to provide a desired level of protection, e.g., a hermetic seal, of the image sensor from the ambient environment. However, it is desirable to form the mounting surface with a minimal width to minimize the overall width of the optical module.

To minimize the overall width of the optical module, in an alternative embodiment, the mounting surface of the lens housing is formed with a locking feature. The locking feature includes a horizontal surface parallel to the joint surface of the substrate and a vertical surface perpendicular to the joint surface and extending downwards from the horizontal surface. The horizontal surface is bonded to the joint surface and the vertical surface is bonded to an interior surface of the sidewall.

Advantageously, to enter into optical module 100, dust and moisture is forced to travel horizontally along the interface distance of the horizontal surface and, in addition, is forced to travel vertically along the interface distance of the vertical surface. By forming a relatively long and tortuous interface between the lens housing and the substrate, the environmental protection of the optical module is enhanced. Further, by forming part of this interface in the vertical direction, this enhanced environmental protection is obtained without a corresponding increase in width of the optical module.

As a further advantage, by bonding the vertical surface of the mounting surface of the lens housing to the interior surface of the sidewall of the substrate, the strength of the bond between the lens housing and the substrate is greatly increased compared to the strength of a butt bond. By increasing the strength of the bond between the lens housing and the substrate, the reliability of the optical module is insured.

In an alternative embodiment, the joint surface is formed with a locking feature similar to that described above for the mounting surface. Forming the joint surface as a locking feature enhances the environmental protection as well as reliability of the optical module while at the same time minimizes the overall width of the optical module.

Also in accordance with the present invention, a method of forming an optical module includes coupling an image sensor to a base of a substrate. A lens housing is coupled to a sidewall of the substrate.

To couple the lens housing, a mounting surface of the lens housing is aligned with a joint surface of the substrate. The mounting surface of the lens housing is bonded to the joint surface of the sidewall thus mounting the lens housing to the substrate. In one embodiment, the mounting surface is bonded to the joint surface by a butt bond.

In an alternative embodiment, the mounting surface includes a locking feature. A horizontal surface of the mounting surface is bonded to the joint surface and a vertical surface of the mounting surface is bonded to an interior surface of the sidewall.

In yet another alternative embodiment, the joint surface includes a locking feature. A horizontal surface of the joint surface is bonded to the mounting surface of the lens housing and a vertical surface of the joint surface is bonded to an exterior side surface of the lens housing.

By forming either the mounting surface or the joint surface as a locking feature, the environmental protection as well as reliability of the optical module is enhanced while at the same time the overall width of the optical module is minimized.

To minimize the cost associated with fabricating the optical module, in one embodiment, a plurality of optical modules are fabricated simultaneously in an array from an image sensor substrate comprising a plurality of substrates integrally connected together. Advantageously, the optical modules are tested for validity while still in an array, which is less labor intensive and thus lower cost than testing each optical module on an individual basis. The image sensor substrate is then singulated, e.g., by mechanical snapping, thus forming a plurality of optical modules.

These and other features and advantages of the present invention will be more readily apparent from the detailed description set forth below taken in conjunction with the accompanying drawings.

BRIEF DESCRIPTION OF THE DRAWINGS

In the following description, the same or similar elements are labeled with the same or similar reference numbers.

DETAILED DESCRIPTION

Figure 1:
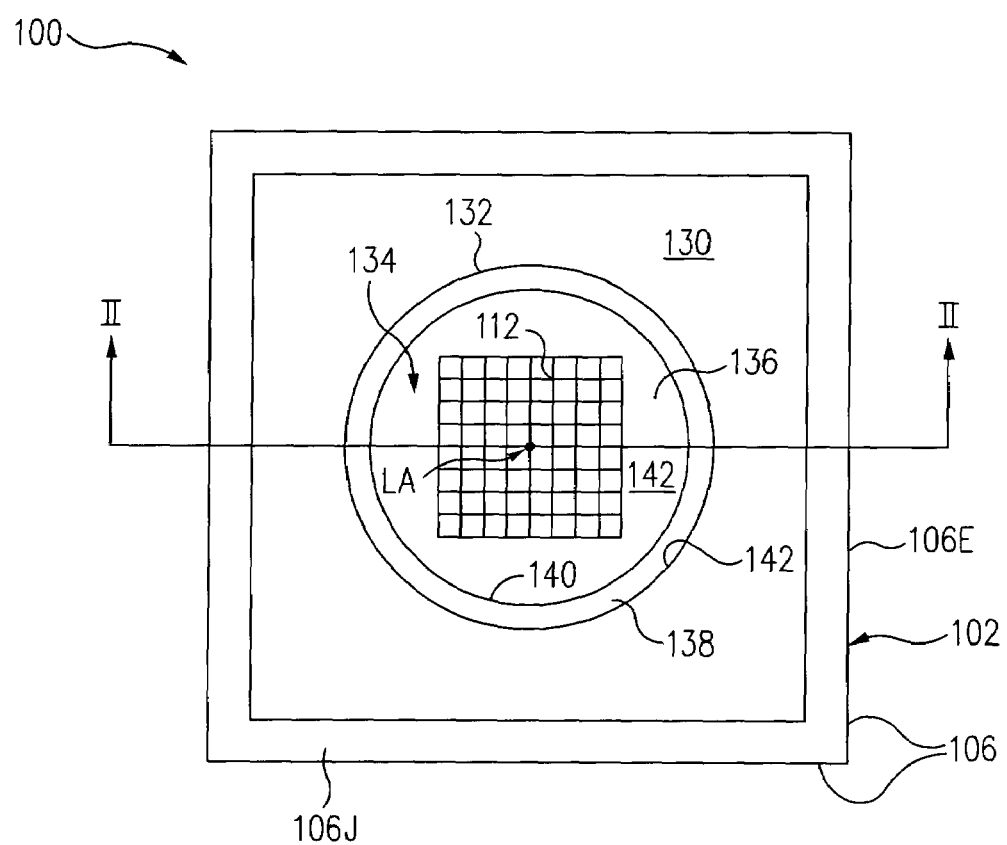
FIG. 1 is a top plan view of an optical module in accordance with one embodiment of the present invention.

In accordance with the present invention, an optical module 100 (FIG. 2) includes a substrate 102 having a base 104 and a sidewall 106. Optical module 100 further includes an image sensor 108 mounted to base 104 and a lens housing 130 mounted to sidewall 106.

Sidewall 106 includes a joint surface 106J and lens housing 130 includes a mounting surface 156A. Mounting surface 156A of lens housing 130 is bonded to joint surface 106J of substrate 102 thus mounting lens housing 130 to sidewall 106.

To minimize the overall width of optical module 100, in one embodiment (FIG. 3B), mounting surface 156A of lens housing 130 is formed with a locking feature. The locking feature includes a horizontal surface 310 parallel to joint surface 106J of substrate 102 and a vertical surface 312 perpendicular to joint surface 106J and extending downwards from horizontal surface 310. Horizontal surface 310 is bonded to joint surface 106J and vertical surface 312 is bonded to an interior surface 106I of sidewall 106 with adhesive 302A.

Advantageously, to enter into optical module 100, dust and moisture is forced to travel horizontally along the interface distance of horizontal surface 310 and, in addition, is forced to travel vertically along the interface distance of vertical surface 312. By forming a relatively long and tortuous interface between lens housing 130 and substrate 102, the environmental protection of optical module 100 is enhanced. Further, by forming part of this interface in the vertical direction, this enhanced environmental protection is obtained without a corresponding increase in width of optical module 100.

Figure 3A:
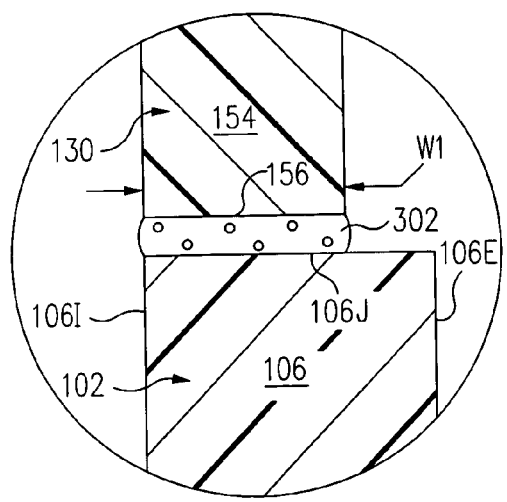
FIGS. 3A, 3B and 3C are enlarged cross-sectional views of the region III of FIG. 2 in accordance with various embodiments of the present invention.

As a further advantage, by bonding vertical surface 312 to interior surface 106I, the strength of the bond between lens housing 130 and substrate 102 is greatly increased compared to the strength of a butt bond such as that illustrated in FIG. 3A. By increasing the strength of the bond between lens housing 130 and substrate 102, the reliability of optical module 100 is insured.

Figure 2:
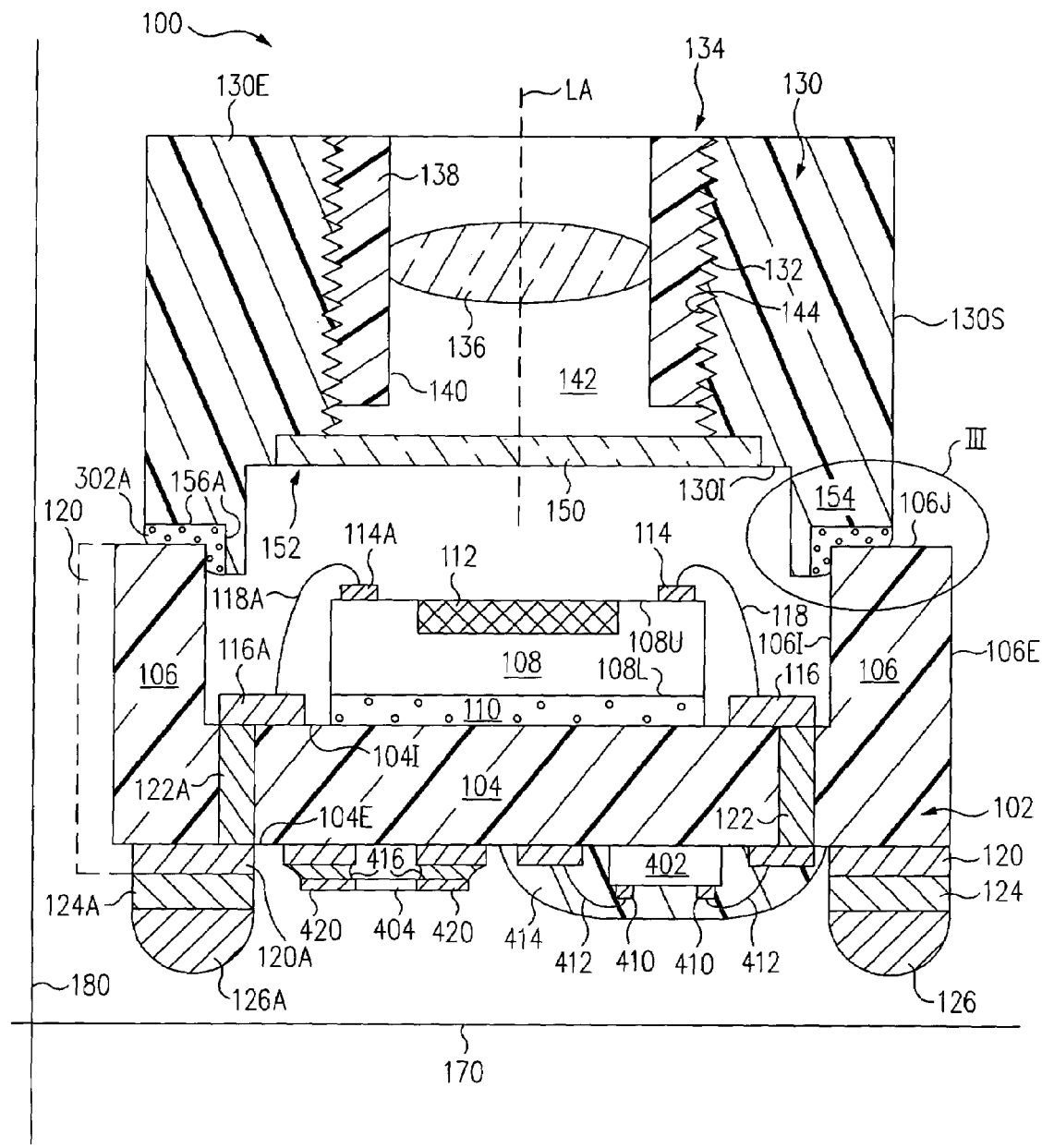
FIG. 2 is a cross-sectional view of the optical module taken along the line II—II of FIG. 1.

More particularly, FIG. 1 is a top plan view of an optical module 100 in accordance with one embodiment of the present invention. FIG. 2 is a cross-sectional view of optical module 100 taken along the line II—II of FIG. 1. Optical module 100 is used in a wide variety of applications, e.g., cameras and cellular telephones.

Referring to FIGS. 1 and 2 together, optical module 100 includes a substrate 102, e.g., formed of ceramic, premolded plastic or laminate. Substrate 102 is a rectangular cup shape enclosure and includes a base 104 and a sidewall 106. Sidewall 106 is formed around a periphery of base 104 and extended upwards, e.g., in a first direction, from base 104. In this embodiment, base 104 and sidewall 106 are integral, i.e., are a single piece and not a plurality of separate pieces connected together.

Base 104 includes an interior, e.g., first, surface 104I and an exterior, e.g., second, surface 104E. Mounted, sometimes called die attached, to interior surface 104I is an image sensor 108. More particularly, a lower, e.g., first, surface 108L of image sensor 108 is mounted to interior surface 104I, for example, with adhesive 110. Image sensor 108 further includes an upper, e.g., second, surface 108U. An active area 112 and bond pads 114 of image sensor 108 are formed on upper surface 108U. In this embodiment, interior surface 104I, lower surface 108L, and upper surface 108U are parallel to one another.

In one embodiment, substrate 102 is laminate, e.g., printed circuit board material. To avoid particulate contamination of active area 112 from substrate 102 in accordance with this embodiment, substrate 102 is treated to remove particulates and/or to bind the particulates to substrate 102. Illustratively, substrate 102 is washed, blown, e.g., air or snow blown, and/or encapsulated with an epoxy coating. Alternatively, or in addition, active area 112 is protected. For example, a window is attached directly over active area 112 and to upper surface 108U of image sensor 108 using a method similar to that described in Webster et al., U.S. patent application Ser. No. 09/490,717, filed Jan. 25, 2000; Glenn et al., U.S. patent application Ser. No. 09/577,692, filed May 22, 2000; and Glenn et al., U.S. patent application Ser. No. 09/610,314, filed Jul. 5, 2000, which are all herein incorporated by reference in their entireties.

Generally, active area 112 of image sensor 108 is responsive to radiation, e.g., electromagnetic radiation, as is well known to those of skill in the art. For example, active area 112 is responsive to infrared radiation, ultraviolet light, and/or visible light. Illustratively, image sensor 108 is a CMOS image sensor device, a charge coupled device (CCD), a pyroelectric ceramic on CMOS device, or an erasable programmable read-only memory device (EPROM) although other image sensors are used in other embodiments.

Formed on interior surface 104I of substrate 102 are a plurality of electrically conductive interior traces 116, which include a first interior trace 116A. Interior traces 116 are electrically connected to bond pads 114 by bond wires 118. To illustrate, a first bond pad 114A of the plurality of bond pads 114 is electrically connected to interior trace 116A by a first bond wire 118A of the plurality of bond wires 118.

Formed on exterior surface 104E of substrate 102 are a plurality of electrically conductive exterior traces 120, which include a first exterior trace 120A. Extending through base 104 from exterior surface 104E to interior surface 104I are a plurality of electrically conductive vias 122, which include a first via 122A. Exterior traces 120 are electrically connected to interior traces 116 by vias 122. To illustrate, exterior trace 120A is electrically connected to interior trace 116A by via 122A.

Formed on exterior traces 120 are electrically conductive pads 124, which include a first pad 124A. Formed on pads 124 are electrically conductive interconnection balls 126, e.g., solder. To illustrate, pad 124A is formed on exterior trace 120A. A first interconnection ball 126A of the plurality of interconnection balls 126 is formed on pad 124A. Interconnection balls 126 are used to connect optical module 100 to a larger substrate 170 such as a printed circuit mother board.

As set forth above, an electrically conductive pathway between bond pad 114A and interconnection ball 126A is formed by bond wire 118A, interior trace 116A, via 122A, exterior trace 120A, and pad 124A. The other bond pads 114, bond wires 118, interior traces 116, vias 122, exterior traces 120, pads 124 and interconnection balls 126 are electrically connected to one another in a similar fashion so are not discussed further to avoid detracting from the principals of the invention.

Although a particular electrically conductive pathway between bond pad 114A and interconnection ball 126A is described above, other electrically conductive pathways can be formed. For example, contact metallizations can be formed between the various electrical conductors, e.g., between bond pads 114 and bond wires 118, between bond wires 118 and interior traces 116, between exterior traces 120 and pads 124, and/or between pads 124 and interconnection balls 126. Alternatively, pads 124 are not formed and interconnection balls 126 are formed directly on exterior traces 120.

As yet another alternative, interconnection balls 126 are distributed in an array format to form a ball grid array (BGA) type optical module. Alternatively, interconnection balls 126 are not formed, e.g., to form a metal land grid array (LGA) type optical module. Typically, with either a BGA or LGA type optical module, optical module 100 is mounted to larger substrate 170, which is parallel to upper surface 108U of image sensor 108.

In yet another alternative, exterior traces 120 extended upwards on an exterior surface 106E of sidewall 106 as indicated by the dashed lines and pads 124/interconnection balls 126 are not formed, e.g., to form a leadless chip carrier (LCC) type optical module. For example, with an LCC type optical module, optical module 100 is mounted with a 90° orientation to a larger substrate 180 such as a printed circuit mother board, which is perpendicular to upper surface 108U of image sensor 108. BGA, LGA and LCC type modules are well known to those of skill in the art.

In another embodiment, a flex connector, sometimes called an edge connector or flex strip, is electrically connected to exterior traces 120, e.g., for applications were optical module 100 is remote from the larger substrate. Other electrically conductive pathway modifications will be obvious to those of skill in the art.

Sidewall 106 of substrate 102 further includes an interior surface 106I. In this embodiment, interior surface 106I is parallel to exterior surface 106E. Further, interior surface 106I and exterior surface 106E are perpendicular to interior surface 104I and exterior surface 104E, which are parallel to one another. Although various structures may be described as being parallel or perpendicular, it is understood that the structures may not be exactly parallel or perpendicular but only substantially parallel or perpendicular to within accepted manufacturing tolerances.

Extending between exterior surface 106E and interior surface 106I of sidewall 106 is a joint surface 106J. A lens housing 130 is mounted to joint surface 106J and generally to sidewall 106 of substrate 102. Illustratively, lens housing 130 is molded plastic such as glass filled NORYL, e.g., glass filled nylon 6/6, although other materials are used in other embodiments. For example, in one embodiment, lens housing 130 is a high temperature plastic such that lens housing 130 maintains integrity during reflow, e.g., during melting of interconnection balls 126. In another embodiment, lens housing 130 is a low temperature plastic, for example, when there is no reflow, e.g., when interconnection balls 126 are not formed.

Lens housing 130 includes an interior cylindrical surface 132, which defines a central aperture 134 having a longitudinal axis LA perpendicular to upper surface 108U of image sensor 108. Central aperture 134 extends upwards and is aligned above active area 112 such that active area 112 is visible through central aperture 134 as best shown in FIG. 1.

To facilitate attachment of an optical element 136 such as a lens (hereinafter lens 136), interior cylindrical surfaced 132 is threaded. Stated another way, central aperture 134 is a female threaded aperture.

Lens 136 is mounted in a support 138, hereinafter referred to as lens support 138. In this embodiment, lens support 138 is a cylindrical annulus having an interior cylindrical surface 140, which defines an aperture 142. Lens 136 is positioned in aperture 142 such that lens 136 and lens support 138 also have longitudinal axis LA. Interior cylindrical surface 140 may not be exactly cylindrical, e.g., is hourglass shaped, but has other shapes in other embodiments.

Lens support 138 has an exterior cylindrical surface 144, which is threaded. Stated another way, lens support 138 is male threaded. Of importance, the threading of exterior cylindrical surface 144 corresponds with the threading of interior cylindrical surface 132 allowing threaded attachment of lens support 138 to lens housing 130.

Lens support 138 is threaded into central aperture 134 so that exterior cylindrical surface 144 is threadedly attached to interior cylindrical surface 132 of lens housing 130.

Advantageously, lens 136 is readily adjusted relative to image sensor 108 by rotating lens support 138. More particularly, lens support 138 is rotated around longitudinal axis LA in a first direction, e.g., clockwise looking downward at lens support 138, to move lens support 138 and lens 136 towards image sensor 108. Conversely, lens support 138 is rotated around longitudinal axis LA in a second direction opposite the first direction, e.g., counterclockwise looking downward at lens support 138, to move lens support 138 and lens 136 away from image sensor 108.

During rotation of lens support 138, a possibility exists that particulates may be generated, e.g., due to friction between lens support 138 and lens housing 130. To prevent these particulates from falling on and contaminating active area 112, a window 150 is mounted to lens housing 130 downwards, e.g., in a second direction, and below central aperture 134.

In this embodiment, central aperture 134 extends from an interior, e.g., first, surface 130I of lens housing 130 to an exterior, e.g., second, surface 130E of lens housing 130. Interior surface 130I includes a pocket 152 corresponding in size to window 150. Window 150 is mounted into pocket 152 and, more generally, to lens housing 130, for example, with adhesive.

During use, radiation is directed at optical module 100. This radiation passes through lens 136 and window 150 and strikes active area 112, which responds to the radiation as is well known to those of skill in the art. In this embodiment, lens support 138 is rotated as described above until radiation passing through lens 136 is properly focused on active area 112 of image sensor 108. Once proper focus is attained, lens support 138 is prevented from unintentional rotation. For example, adhesive is applied to secure lens support 138 to lens housing 130.

In an alternative embodiment, active area 112 of image sensor 108 transmits radiation such as electromagnetic radiation. For example, image sensor 108 is a light emitting diode (LED) micro-display. In accordance with this embodiment, radiation transmitted by active area 112 passes through window 150, through lens 136 and emanates from optical module 100. For simplicity, in the above and following discussions, active area 112 as a receiver of radiation is set forth. However, in light of this disclosure, those of skill in the art will recognize that generally active area 112 can be a receiver of radiation, a transmitter of radiation, or a transceiver, i.e., a transmitter and a receiver, of radiation.

In this embodiment, lens housing 130 is cap shaped. More particularly, extending downwards from interior surface 130I of lens housing 130 is a mounting rim 154 having a mounting surface 156A as described in greater detail below with reference to FIGS. 3A, 3B and 3C. However, in an alternative embodiment, lens housing 130 is formed without a mounting rim 154 and interior surface 130I includes mounting surface 156A, i.e., mounting surface 156A is the periphery of interior surface 130I.

Referring again to the embodiment illustrated in FIG. 2, mounting surface 156A is bonded, sometimes called mounted or attached, to joint surface 106J of substrate 102. In this manner, lens housing 130 is mounted to substrate 102.

FIG. 3A is an enlarged cross-sectional view of the region III of FIG. 2 in accordance with one embodiment of the present invention. Referring now to FIGS. 2 and 3A together, mounting surface 156 of lens housing 130 is planar. Similarly, joint surface 106J of substrate 102 is also planar. Adhesive 302 between mounting surface 156 and joint surface 106J bonds mounting surface 156 to joint surface 106J. Such a bond between planar surfaces is typically referred to as a butt bond.

Further, adhesive 302 forms a seal between lens housing 130 and substrate 102, which protects image sensor 108 from environmental degradation, e.g., from dust and moisture. More particularly, substrate 102, lens housing 130 and adhesive 302 form an enclosure around image sensor 108 and protect image sensor 108 from the ambient environment.

Mounting surface 156 has a width W1 sufficient to provide a desired level of protection, e.g., a hermetic seal, of image sensor 108 from the ambient environment, e.g., from dust and moisture (hereinafter referred to as environmental protection). Generally, to maximize environmental protection of image sensor 108, width W1 should also be maximized to increase the distance, sometimes called the interface distance, over which dust and moisture must travel at the interface of mounting surface 156 and joint surface 106J to enter into optical module 100. In one embodiment, width W1 is 0.75 mm to 1.0 mm. However, maximizing width W1 correspondingly increases the overall width of optical module 100 yet it is desirable to minimize the overall width of optical module 100.

Figure 3B:
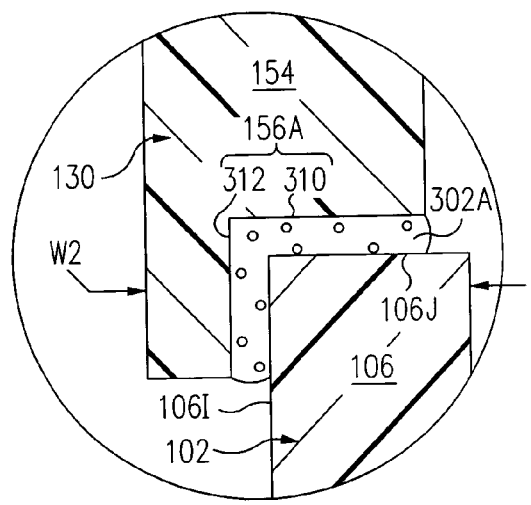

FIG. 3B is an enlarged cross-sectional view of the region III of FIG. 2 in accordance with an alternative embodiment of the present invention. Referring now to FIGS. 2 and 3B together, in accordance with this embodiment, mounting surface 156A is a locking feature. More particularly, mounting surface 156A is a step like locking feature having a horizontal, e.g., first, surface 310 parallel to joint surface 106J and a vertical, e.g., second, surface 312 perpendicular to joint surface 106J and extending downwards from horizontal surface 310.

Adhesive 302A is between horizontal surface 310 and joint surface 106J and is also between vertical surface 312 and interior surface 106I of sidewall 106. Accordingly, to enter into optical module 100, dust and moisture is forced to travel horizontally along the interface distance of horizontal surface 310 and, in addition, is forced to travel vertically along the interface distance of vertical surface 312. By forming a relatively long and tortuous interface between lens housing 130 and substrate 102, the environmental protection of optical module 100 is enhanced. Further, by forming part of the interface between lens housing 130 and substrate 102 in the vertical direction, i.e., between vertical surface 312 and interior surface 106I of sidewall 106, this enhanced environmental protection is obtained without a corresponding increase in width of optical module 100. For example, a width W2 of the combination of mounting rim 154 and sidewall 106 is 0.5 mm or less.

Adhesive 302A forms a bond between horizontal surface 310 and joint surface 106J. In addition, adhesive 302A forms a bond between vertical surface 312 and interior surface 106I of sidewall 106. Advantageously, by bonding vertical surface 312 to interior surface 106I, the strength of the bond between lens housing 130 and substrate 102 is greatly increased compared to the strength of a butt bond such as that illustrated in FIG. 3A. By increasing the strength of the bond between lens housing 130 and substrate 102, the reliability of optical module 100 is insured.

Figure 3C:
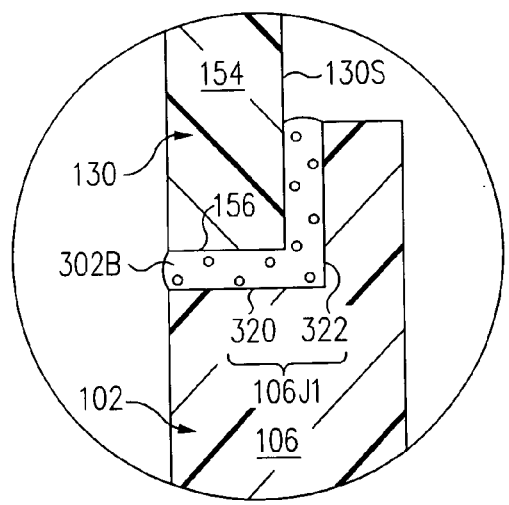

FIG. 3C is an enlarged cross-sectional view of the region III of FIG. 2 in accordance with another alternative embodiment of the present invention. Referring now to FIGS. 2 and 3C, in accordance with this embodiment, joint surface 106J1 is a locking feature. More particularly, joint surface 106J1 is a step like locking feature having a horizontal, e.g., first, surface 320 parallel to mounting surface 156 and a vertical, e.g., second, surface 322 perpendicular to mounting surface 156 and extending upwards from horizontal surface 320.

Adhesive 302B is between horizontal surface 320 and mounting surface 156 and is also between vertical surface 322 and an exterior side surface 130S of lens housing 130. For reasons similar to those discussed above in regards to FIG. 3B, forming joint surface 106J1 as a locking feature enhances the environmental protection as well as reliability of optical module 100 while at the same time minimizes the overall width of optical module 100.

Figure 4:
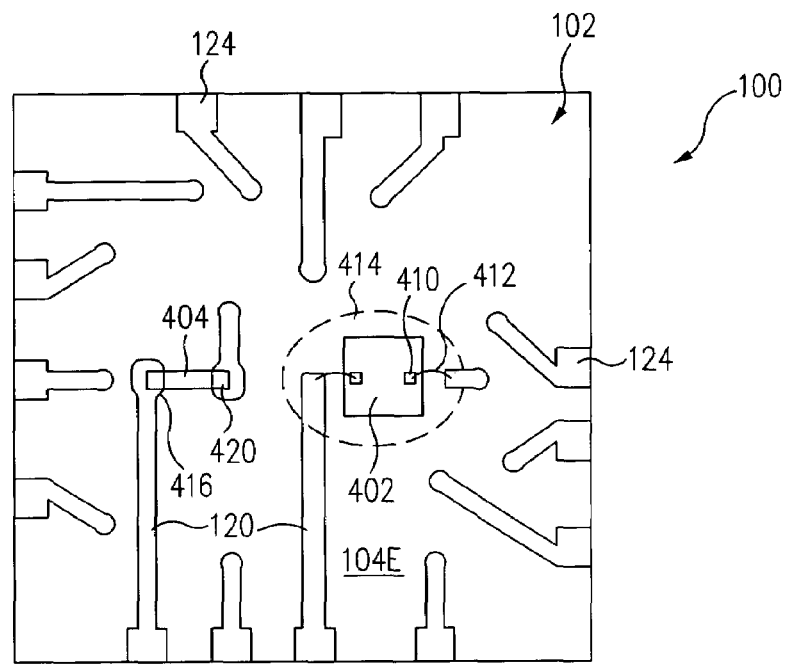
FIG. 4 is a bottom plan view of the optical module of FIG. 2 in accordance with one embodiment of the present invention.

FIG. 4 is a bottom plan view of optical module 100 of FIG. 2 in accordance with one embodiment of the present invention. Referring now to FIGS. 2 and 4, in accordance with this embodiment, one or more electronic components 402, 404 are mounted to exterior surface 104E of base 104 of substrate 102. Electronic components 402, 404 are sometimes referred to as surface mounted components.

Illustratively, electronic component 402 is an active component such as an integrated circuit, e.g., an ASIC such as a controller chip for image sensor 108. As a further illustration, electronic component 404 is a passive component such as a resistor, capacitor, or inductor. Electronic components 402, 404 are hereinafter referred to as active component 402 and passive component 404, respectively. Generally, an active component actively changes an electronic signal whereas a passive component simply has an interaction with an electronic signal.

Although a single active component 402 and a single passive component 404 are illustrated in FIGS. 2 and 4, optical module 100 includes more than one active component 402 and/or more than one passive component 404 in alternative embodiments. In other alternative embodiments, optical module 100 does not contain any active components 402, does not contain any passive components 404, or does not contain any active components 402 or passive components 404.

In FIG. 4, exterior traces 120 are illustrated for purposes of clarity. However, exterior traces 120 are typically covered with a dielectric protective layer as those of skill in the art will understand. Further, interconnection balls 126 are not illustrated also for purposes of clarity.

Referring still to FIGS. 2 and 4 together, active component 402 is mounted to exterior surface 104E of base 104, e.g., with adhesive. Bond pads 410 of active component 402 are electrically connected to exterior traces 120 by bond wires 412. Although two bond pads 410 are illustrated in FIG. 4, those of skill in the art will understand that the number of bond pads 410 depends upon the particular input/output requirements of active component 402. To protect active component 402 and bond wires 412, active component 402 and bond wires 412 are sealed in an encapsulant 414, sometimes called glob top encapsulated.

Passive component 404 is surface mounted to exterior traces 120, for example, with solder 416. More particularly, connector ends 420 of passive component 404 are mounted to exterior traces 120 by solder 416.

Although particular mountings for active component 402 and passive component 404 are illustrated in FIGS. 2 and 4, and discussed above, in alternative embodiments, active component 402 and/or passive component 404 are mounted using other well known techniques, e.g., flip-chip mounted.

Figure 5:
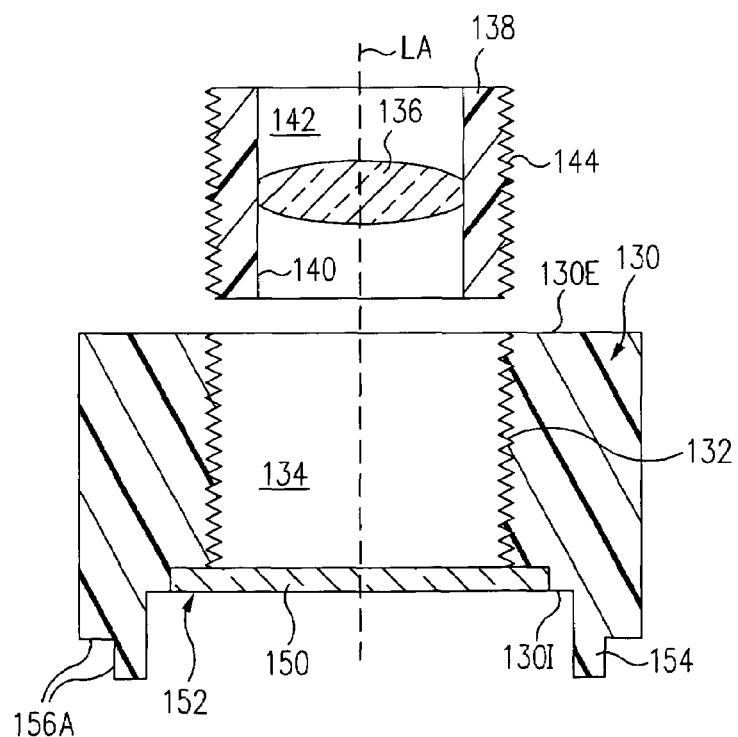
FIG. 5 is a cross-sectional view of a lens housing during assembly in accordance with one embodiment of the present invention.

FIG. 5 is a cross-sectional view of lens housing 130 during assembly in accordance with one embodiment of the present invention. As shown in FIG. 5, window 150 is mounted into pocket 152 of lens housing 130, e.g., with adhesive. Lens 136 is mounted into lens support 138, e.g., with adhesive. Although mounting of a single lens 136 is illustrated, in alternative embodiments, more than one lens 136 or other optical elements are mounted into lens support 138.

Lens support 138 is positioned directly above central aperture 134 such that exterior cylindrical surface 144 of lens support 138 is aligned with interior cylindrical surface 132 of central aperture 134. Lens support 138 is rotated in a first direction to threadedly attach exterior cylindrical surface 144 to interior cylindrical surface 132 and thus to threadedly attached lens support 138 to lens housing 130 as illustrated in FIG. 2. Although window 150 is mounted to lens housing 130 before lens support 138, in an alternative embodiment, lens support 138 is threadedly attached to lens housing 130 before window 150 is mounted to lens housing 130. In yet another embodiment, window 150 is not used.

Figure 6A:
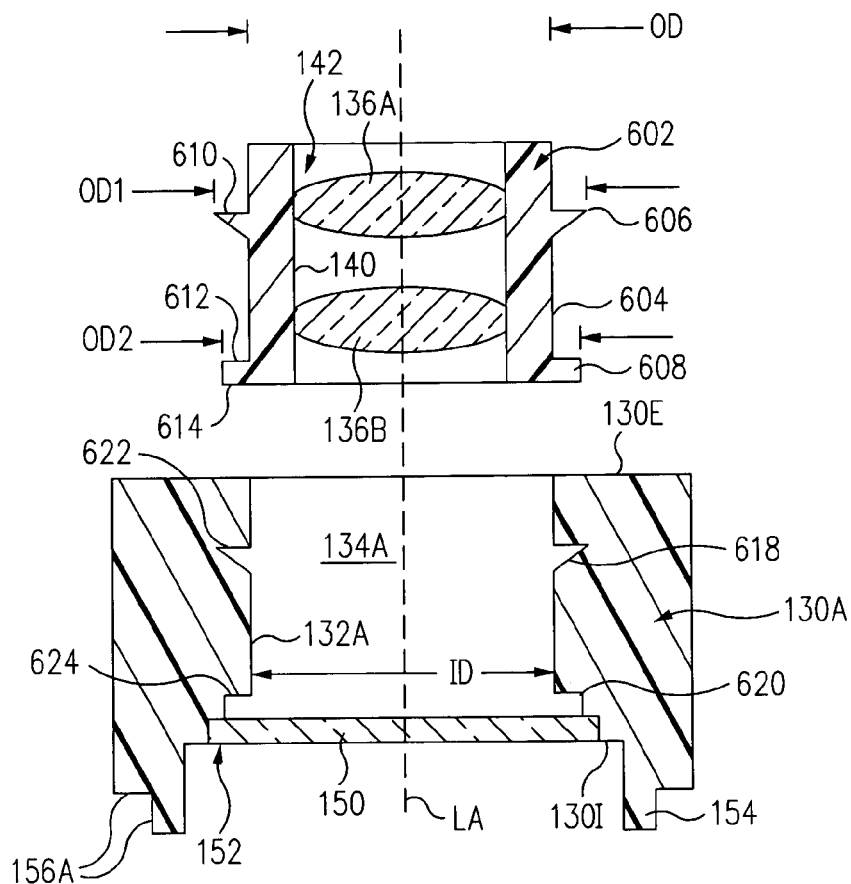
FIG. 6A is a cross-sectional view of a lens housing during assembly in accordance with another embodiment of the present invention.

FIG. 6A is a cross-sectional view of a lens housing 130A during assembly in accordance with another embodiment of the present invention. As shown in FIG. 6A, window 150 is mounted into pocket 152 of lens housing 130A, e.g., with adhesive. Lenses 136A, 136B are mounted into a snap barrel lens support 602, e.g., with adhesive. More particularly, lenses 136A, 136B are mounted to interior cylindrical surface 140 and in aperture 142 of snap barrel lens support 602.

In accordance with this embodiment, snap barrel lens support 602 is designed to snap mount into lens housing 130A. For this reason, exterior surface 604 of snap barrel lens support 602 includes one or more locking features. In this embodiment, exterior surface 604 includes a first locking feature 606 and a second locking feature 608.

Locking features 606, 608 are tabs extending outward from exterior surface 604 and away from longitudinal axis LA of snap barrel lens support 602 in a direction perpendicular to longitudinal axis LA. Locking features 606, 608 are hereinafter referred to as tabs 606, 608, respectively.

As shown in FIG. 6A, tab 606 is triangular in cross-section and includes a lip 610. Tab 608 is rectangular in cross-section and includes an upper, e.g., first, lip 612 and a lower, e.g., second, lip 614.

Lens housing 130A includes an interior cylindrical surface 132A, which is smooth in this embodiment. However, formed in interior cylindrical surface 132A are one or more locking features corresponding to the locking features of snap barrel lens support 602, e.g., corresponding to tabs 606, 608. More particularly, interior cylindrical surface 132A includes a first locking feature 618 and a second locking feature 620 corresponding to tabs 606, 608, respectively, of snap barrel lens support 602.

Locking features 618, 620 are notches extending outward from interior cylindrical surface 132A and away from longitudinal axis LA of central aperture 134A and in a direction perpendicular to longitudinal axis LA. Locking features 618, 620 are hereinafter referred to as notches 618, 620, respectively.

As shown in FIG. 6A, notch 618 is triangular in cross-section and includes a shelf 622. Notch 620 is step shaped in cross-section and includes a shelf 624.

Generally, the inner diameter ID of central aperture 134A of lens housing 130A is approximately equal to and slightly greater than the outer diameter OD of exterior surface 604 of snap barrel lens support 602. However, the maximum outer diameter OD1 of tab 606 is slightly greater than inner diameter ID. Similarly, the maximum outer diameter OD2 of tab 608 is slightly greater than inner diameter ID.

Figure 6B:
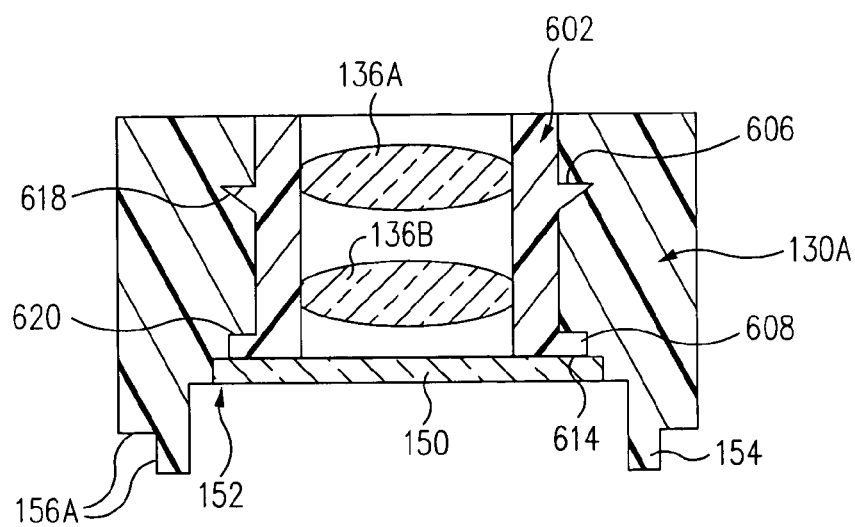
FIG. 6B is a cross-sectional view of the lens housing of FIG. 6A assembled with a snap barrel lens support.

FIG. 6B is a cross-sectional view of lens housing 130A of FIG. 6A assembled with snap barrel lens support 602. Referring now to FIGS. 6A and 6B together, to mount snap barrel lens support 602 to lens housing 130A, snap barrel lens support 602 is aligned directly above central aperture 134A as shown in FIG. 6A.

Snap barrel lens support 602 is moved downwards and pressed into central aperture 134A. Since outer diameter OD1 and outer diameter OD2 of tabs 606, 608, respectively, are greater than inner diameter ID of central aperture 134A, pressing of snap barrel lens support 602 causes tabs 606, 608, to be compressed inwards towards longitudinal axis LA. Tabs 606, 608 are slid along interior cylindrical surface 132A to notches 618, 620. Upon reaching notches 618, 620, tabs 606, 608 snap outwards and into notches 618, 620, respectively, thus mounting snap barrel lens support 602 to lens housing 130A.

Referring now to FIG. 6B, once tab 606 snaps into notch 618, lip 610 (FIG. 6A) of tab 606 is engaged with shelf 622 (FIG. 6A) of notch 618. Similarly, once tab 608 snaps into notch 620, upper lip 612 (FIG. 6A) of tab 608 is engaged with shelf 624 (FIG. 6A) of notch 620 and lower lip 614 is engaged with window 150. This engagement of lips 610, 612 with shelves 622, 624, respectively, prevents snap barrel lens support 602 from being unintentionally removed from central aperture 134A. In one embodiment, adhesive is applied to further secure snap barrel lens support 602 to lens housing 130A.

Once snap barrel lens support 602 is mounted to lens housing 130A, the position of lenses 136A, 136B are fixed.

Figure 7:
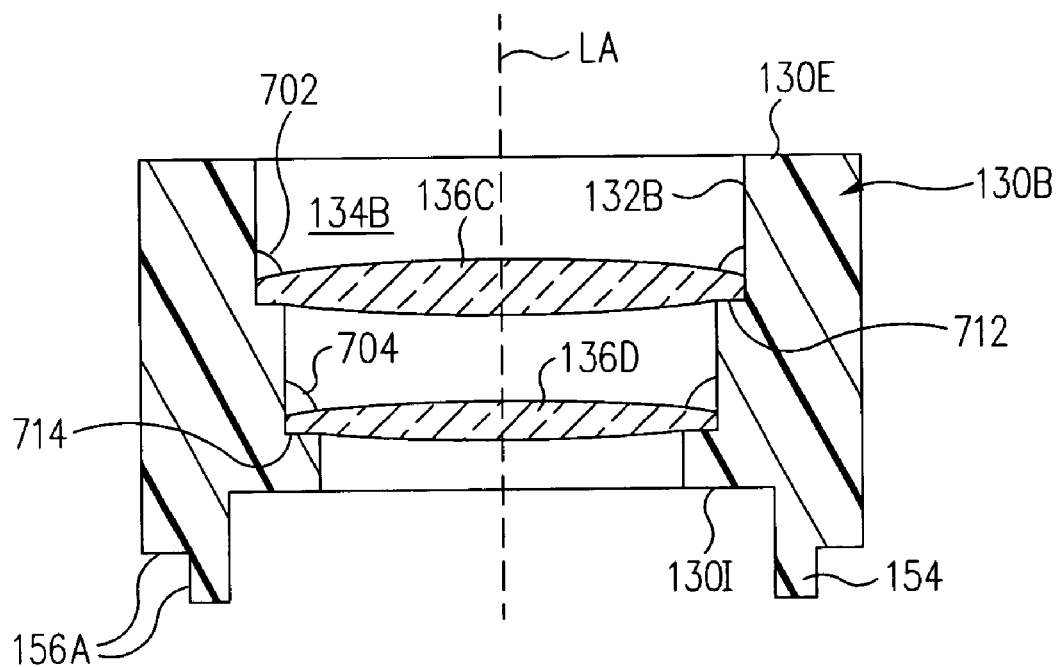
FIG. 7 is a cross-sectional view of a fixed focus lens housing in accordance with yet another alternative embodiment of the present invention.

This type of assembly is sometimes referred to as a fixed focus lens assembly. FIG. 7 is a cross-sectional view of a fixed focus lens housing 130B in accordance with yet another alternative embodiment of the present invention.

Referring now to FIG. 7, in accordance with this embodiment, lenses 136C, 136D are mounted directly in central aperture 134B of lens housing 130B. More particularly, lens 136C, 136D are mounted to interior cylindrical surface 132B, for example, with adhesives 702, 704 such as epoxy. To facilitate positioning and mounting of lenses 136C, 136D, in one embodiment, interior cylindrical surface 132B is formed with shelves 712, 714 protruding inwards from interior cylindrical surface 132B towards longitudinal axis LA. Lenses 136C, 136D are placed on shelves 712, 714, respectively, and adhesives 702, 704 are applied around the peripheries of lenses 136C, 136D and cured, if necessary, thus mounting lenses 136C, 136D to lens housing 130B.

Since lenses 136C, 136D are fixed in place, any possibility of particulate generation due to motion of lenses 136C, 136D is eliminated. Accordingly, in this embodiment, a window is unnecessary and is not used. However, in an alternative embodiment, a window similar to window 150 of optical module 100 of FIG. 2 is used. In another alternative embodiment, lenses 136C, 136D do not have any optical power or properties but are transparent windows. For example, only a single window, e.g., lens 136C or 136D, is used. Lens housing 130B in accordance with this embodiment is sometimes called a cap lid with window.

Figure 8:
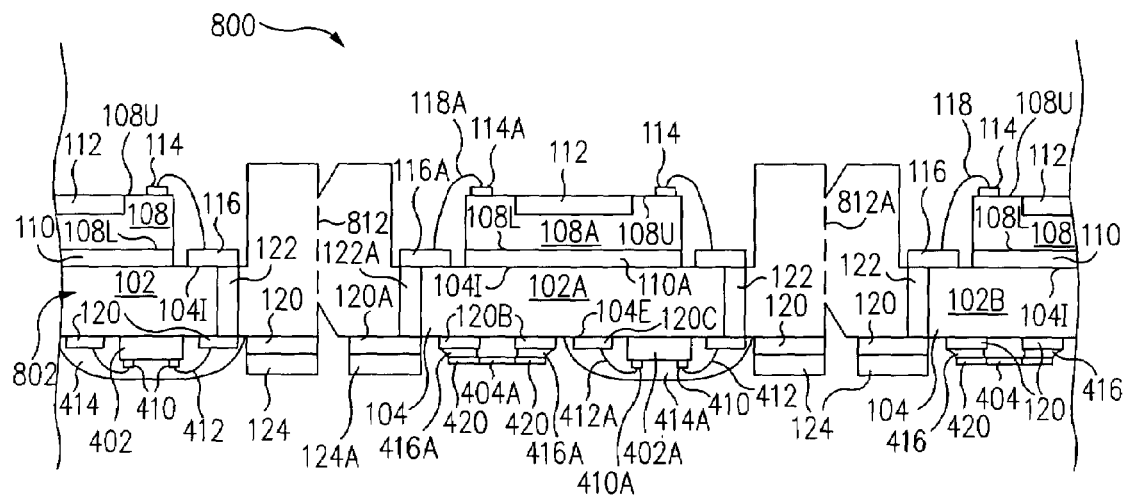
FIG. 8 is a cross-sectional view of an assembly during the fabrication of a plurality of optical modules in accordance with one embodiment of the present intention.

FIG. 8 is a cross-sectional view of an assembly 800 during the fabrication of a plurality of optical modules 100 in accordance with one embodiment of the present intention. Referring now to FIG. 8, assembly 800 includes an image sensor substrate 802 comprising a plurality of individual substrates 102 integrally connected together. Each of substrates 102 is delineated by a singulation street 812, which is located between adjacent substrates 102. For example, a first singulation street 812A of a plurality of singulation streets 812 delineates a first substrate 102A of the plurality of substrates 102 from a second substrate 102B of the plurality of substrates 102. The other substrates 102 are similarly delineated from adjacent substrates 102 by corresponding singulation streets 812.

Substrates 102 include interior traces 116 on interior surfaces 104I of bases 104 of substrates 102. Substrates 102 also include vias 122 extending through bases 104 of substrates 102. Substrates 102 further include exterior traces 120 and pads 124 on exterior surfaces 104E of bases 104 of substrates 102.

Passive components 404 are mounted to exterior traces 120 by solders 416 formed between connector ends 420 of passive components 404 and exterior traces 120. To illustrate, a first passive component 404A of the plurality of passive components 404 is mounted to exterior traces 120B of the plurality of exterior traces 120 by solders 416A of the plurality of solders 416.

To mount passive component 404A, in one embodiment, solder paste is applied, e.g., by screening, to exterior traces 120B. Connector ends 420 of passive component 404A are placed in contact with the solder paste. Assembly 800 is heated to melt the solder paste and form solders 416A between connector ends 420 of passive component 404A and exterior traces 120B. The other passive components 404 are mounted to exterior traces 120 in a similar manner and, typically, simultaneously.

Active components 402 are mounted to exterior surfaces 104E of bases 104 of substrates 102, e.g., with die attach adhesives. To illustrate, a first active component 402A of the plurality of active components 402 is mounted to exterior surface 104E of base 104 of substrate 102A by adhesive such that bond pads 410 are facing outwards and are exposed. The other active components 402 are mounted to substrates 102 in a similar manner.

Bond pads 410 of active components 402 are electrically connected to exterior traces 120 by bond wires 412 formed using a wirebonding tool. To illustrate, active component 402A includes a first bond pad 410A of the plurality of bond pads 410. Bond pad 410A is electrically connected to an exterior trace 120C of the plurality of exterior traces 120 by a first bond wire 412A of the plurality of bond wires 412. The other bond pads 410 are electrically connected to exterior traces 120 by bond wires 412 in a similar manner.

Active components 402, bond wires 412 and bond pads 410 are sealed in encapsulants 414, sometimes called glob top encapsulated. To illustrate, active component 402A and the corresponding bond wires 412 and bond pads 410 are sealed in a first encapsulant 414A of the plurality of encapsulant 414. In one embodiment, to form encapsulant 414A, an encapsulant is dispensed, e.g., using a needle dispenser, to cover active component 402A and the corresponding bond wires 412 and bond pads 410. The encapsulant is cured, if necessary, to form encapsulant 414A. The other encapsulants 414 are formed in a similar manner.

Although particular techniques for attaching active components 402 and passive components 404 are described above, active components 402 and passive components 404 can be attached to substrates 102 in a variety of different manners. For example, active components 402 can be flip-chip mounted to exterior traces 120. The particular techniques used to attach active components 402 and passive components 404 are not essential to the invention.

Lower surfaces 108L of image sensors 108 are attached to interior surfaces 104I of bases 104 of substrates 102 by adhesives 110. To illustrate, a lower surface 108L of a first image sensor 108A of the plurality of image sensors 108 is attached to interior surface 104I of base 104 of substrate 102A by a first adhesive 110A of the plurality of adhesives 110. The other image sensors 108 are similarly attached.

Bond pads 114 of image sensors 108 are electrically connected to interior traces 116 by bond wires 118 using a wirebonding tool. To illustrate, image sensor 108A includes bond pad 114A on upper surface 108U of image sensor 108A. Bond pad 114A is electrically connected to interior trace 116A by bond wire 118A. The other bond pads 114 are electrically connected to the other interior traces 116 by the other bond wires 118 in a similar manner.

Figure 9:
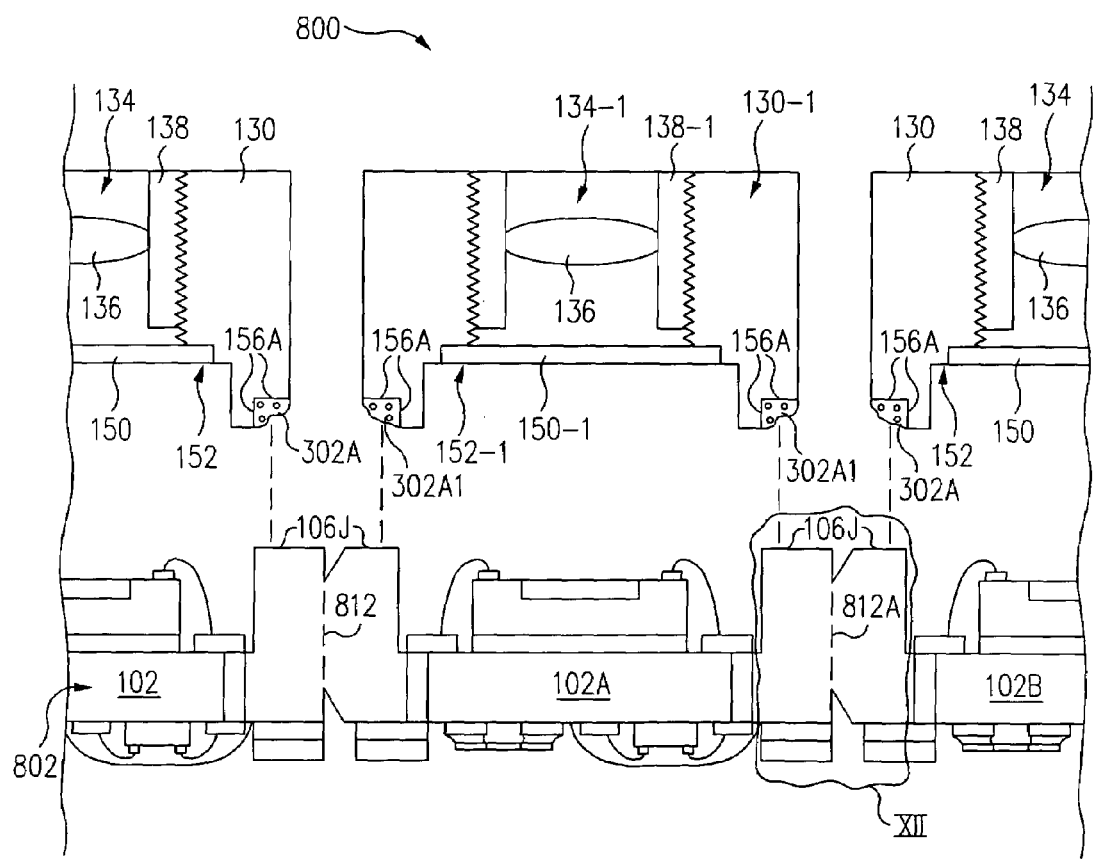
FIGS. 9, 10 and 11 are cross-sectional views of the assembly of FIG. 8 at further stages during fabrication.

FIG. 9 is a cross-sectional view of assembly 800 of FIG. 8 at a further stage during fabrication. Referring now to FIG. 9, lens housings 130 are assembled. Illustratively, windows 150 are mounted into pockets 152, e.g., with adhesives, in lens housings 130. Lens supports 138 are mounted into central apertures 134 of lens housings 130.

To illustrate, a first lens housing 130-1 of the plurality of lens housings 130 includes a first pocket 152-1 of the plurality of pockets 152. A first window 150-1 of the plurality windows 150 is mounted into pocket 152-1. Lens housing 130-1 further includes a first central aperture 134-1 of the plurality of central apertures 134. A first lens support 138-1 of the plurality of lens supports 138 is threaded into central aperture 134-1. The other windows 150 and lens supports 138 are mounted to the other lens housings 130 in a similar manner.

Adhesives 302A are applied to mounting surfaces 156A of lens housings 130 or, alternatively, to joint surfaces 106J of substrates 102. To illustrate, a first adhesive 302A1 of the plurality of adhesives 302A is applied to mounting surface 156A of lens housing 130-1. The other adhesives 302A are applied in a similar manner.

Lens housings 130 are aligned with substrates 102, e.g., with a mechanical or optical alignment system. To illustrate, mounting surface 156A of lens housing 130-1 is aligned with joint surface 106J of substrate 102A. The other lens housings 130 are aligned with the other substrates 102 in a similar manner.

Figure 10:
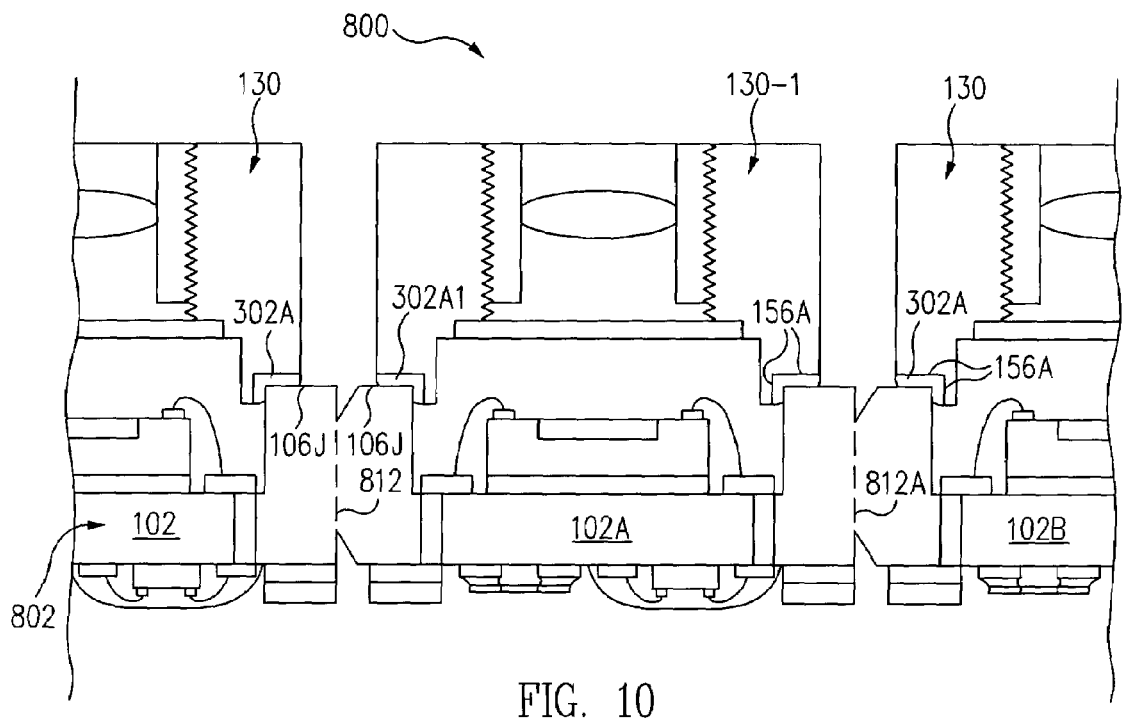

FIG. 10 is a cross-sectional view of assembly 800 of FIG. 9 at a further stage during fabrication. Referring now to FIGS. 9 and 10 together, lens housings 130 are mounted to substrates 102. Generally, lens housings 130 are moved downwards such that adhesives 302A are squeezed between substrates 102 and lens housings 130. Adhesives 302A are cured, if necessary, thus mounting lens housings 130 to substrates 102.

To illustrate, lens housing 130-1 is moved downwards to squeeze adhesive 302A1 between lens housing 130-1 and substrate 102A. Adhesive 302A1 is cured, if necessary, thus mounting lens housing 130-1 to substrate 102A. The other lens housings 130 are mounted to the other substrates 102 by adhesives 302A in a similar manner.

Figure 11:
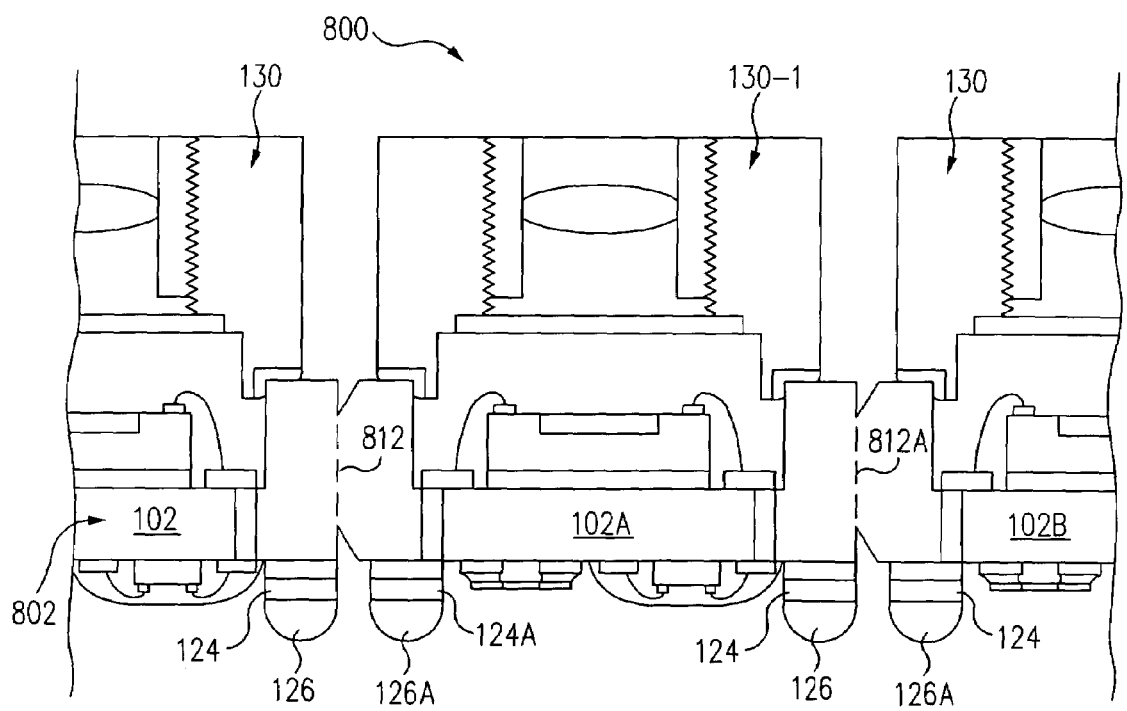

FIG. 11 is a cross-sectional view of assembly 800 of FIG. 10 at a further stage during fabrication in accordance with one embodiment of the present invention. As shown in FIG. 11, interconnection balls 126, e.g., solder, are formed on pads 124. To illustrate, interconnection ball 126A is formed on pad 124A. The other interconnection balls 126 are formed on the other pads 124 in a similar manner.

In one embodiment, each optical module 100 is tested for validity, i.e., to determine whether the optical module 100 is defective or not. Advantageously, testing optical modules 100 while still in an array format is less labor intensive and thus lower cost than testing each optical module 100 on an individual basis.

Image sensor substrate 802 is then singulated along singulation streets 812 to form a plurality of optical modules 100. In this embodiment, image sensor substrate 802 is a snap straight substrate designed to be singulated by mechanically snapping along singulation streets 812. To facilitate this snapping, image sensor substrate 802 is formed with snapping features along singulation streets 812 as discussed in greater detail below with reference to FIG. 12A.

Figure 12A:
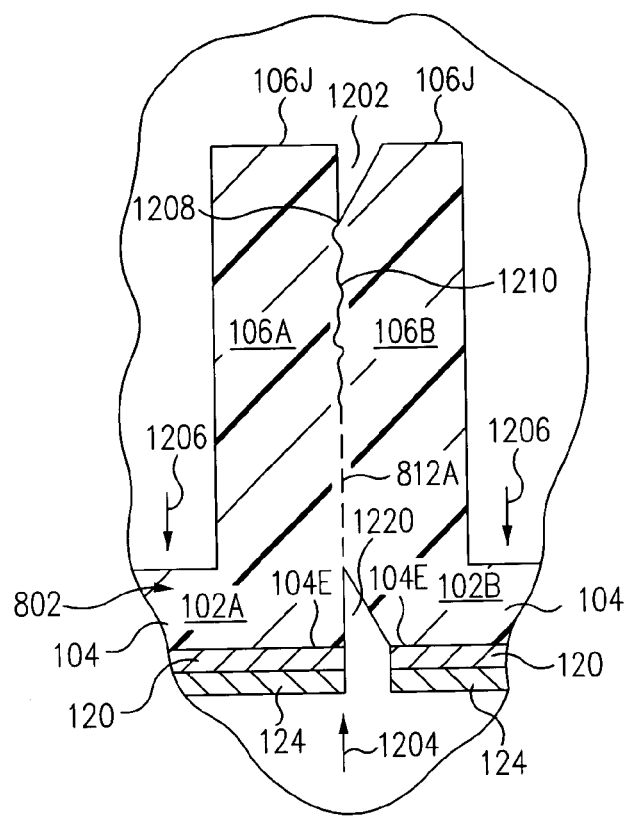
FIGS. 12A, 12B are enlarged cross-sectional views of the region XII of an image sensor substrate of FIG. 9 during snapping in accordance with various embodiments of the present invention.

FIG. 12A is an enlarged cross-sectional view of the region XII of image sensor substrate 802 of FIG. 9 during snapping in accordance with one embodiment of the present invention. Referring now to FIG. 12A, a score 1202, sometimes called a snapping feature, groove, trench, or cut, is formed along singulation street 812A and between adjacent sidewalls 106 of adjacent substrates 102. More particularly, score 1202 is formed between sidewall 106A of substrate 102A and sidewall 106B of substrate 102B. Score 1202 it is a V-shaped groove extending downwards from joint surfaces 106J of sidewalls 106A, 106B.

To snap image sensor substrate 802, image sensor substrate 802 is pressed upwards along singulation street 812A as indicated by arrow 1204 and simultaneously pressed downwards along substrate 102A and substrate 102B as indicated by arrows 1206. This bending force is concentrated at apex 1208 of score 1202 causing a crack 1210 to form along singulation street 812A. In this manner, image sensor substrate 802 is singulated and, more particularly, substrate 102A is singulated from substrate 102B.

In accordance with this embodiment, a score 1220, substantially identical to score 1202 but inverted, is also formed along singulation street 812A. Score 1220 is formed between sidewall 106A of substrate 102A and sidewall 106B of substrate 102B. Score 1220 is an inverted V-shaped groove extending upwards from exterior surfaces 104E of bases 104 of substrates 102A, 102B.

Score 1220 facilitate snapping of image sensor substrate 802 in a manner similar to that described above in regards to score 1202. More particularly, score 1220 facilitate snapping of image sensor substrate 802 when pressed downwards along singulation street 812A in a direction opposite arrow 1204 while simultaneously pressing upwards on substrates 102A, 102B in a direction opposite arrows 1206. Although both scores 1202 and 1220 are illustrated in FIG. 12A, in alternative embodiments, only score 1202 or 1220 is formed. In yet another alternative embodiment, neither score 1202 or score 1220 is formed. For example, image sensor substrate 802 is singulated by mechanical or laser sawing along singulation streets 812 and scores 1202, 1220 are not formed.

Figure 12B:
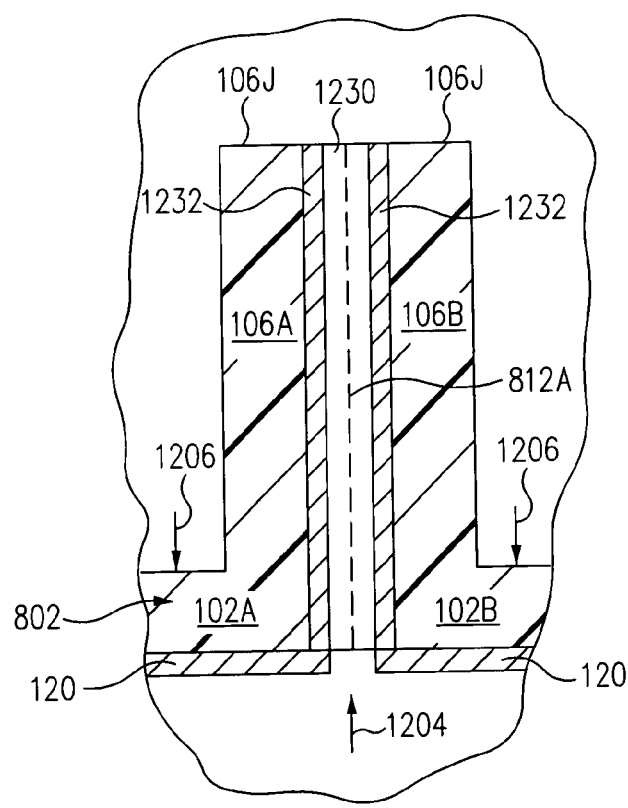

FIG. 12B is an enlarged cross-sectional view of the region XII of image sensor substrate 802 of FIG. 9 during snapping in accordance with another embodiment of the present invention. Referring now to FIG. 12B, in accordance with this embodiment, through-holes 1230, sometimes called snapping features, are formed, e.g., by drilling, along singulation street 812A. Through-holes 1230 cause image sensor substrate 802 to have less mechanical strength along singulation street 812A than along substrate 102A or substrate 102B. Accordingly, when image sensor substrate 802 is bent as indicated by arrows 1204, 1206 (or opposite arrows 1204, 1206), image sensor substrate 802 snaps along singulation street 812A thus singulating substrate 102A from substrate 102B.

In one embodiment, optical modules 100 are formed as LCC type modules. In accordance with this embodiment, interconnection balls 126 are not formed as illustrated in FIG. 11. Instead, through-holes 1230 are lined with an electrically conductive material 1232, which becomes an extension of exterior traces 120 on exterior surfaces 106E of sidewalls 106A, 106B. More particularly, after snapping of image sensor substrate 802, electrically conductive material 1232 remains along exterior surfaces 106E of sidewalls 106A, 106B and forms extensions of exterior traces 120.

In FIGS. 8, 9, 10 and 11, mounting of lens housings 130 (FIG. 5) to substrates 102 is illustrated. However, in alternative embodiments, lens housings 130A (FIGS. 6A, 6B) or lens housings 130B (FIG. 7) are mounted to substrates 102 in a similar manner.

Forming a plurality of optical modules 100 simultaneously is less labor intensive, less complex, and thus less expensive than forming optical modules 100 on an individual basis. However, it is understood that optical modules 100 can also be fabricated individually, if desired.

This application is related to Webster et al., co-filed and commonly assigned U.S. patent application Ser. No. 09/764,165, entitled "OPTICAL MODULE WITH LENS INTEGRAL HOLDER", which is herein incorporated by reference in its entirety.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A method of forming an optical module comprising:
coupling an image sensor to a base of a substrate;
coupling a lens housing to a sidewall of said substrate, wherein said substrate is one of a plurality of substrates coupled together in an image sensor substrate; and
singulating said image sensor substrate.

2. The method of claim 1 wherein said base comprises a first surface, a first surface of said image sensor being coupled to said first surface of said base.

3. The method of claim 2 wherein said image sensor comprises a second surface comprising a bond pad, said method further comprising electrically coupling said bond pad to an interior trace on said first surface of said base.

4. The method of claim 1 further comprising coupling a window to said lens housing.

5. The method of claim 1 further comprising coupling an optical element to said lens housing.

6. The method of claim 5 wherein said optical element comprises a lens.

7. The method of claim 1 further comprising coupling a lens support to said lens housing.

8. The method of claim 7 wherein said coupling a lens support comprises threading said lens support into a central aperture of said lens housing.

9. The method of claim 8 wherein an active area of said image sensor is visible through said central aperture.

10. The method of claim 9 further comprising:
directing radiation at said optical module; and
rotating said lens support to focus said radiation on said active area.

11. The method of claim 7 wherein said lens support is snap mounted into said lens housing.

12. The method of claim 1 wherein said singulating comprises snapping said image sensor substrate.

13. A method comprising:
coupling an image sensor to a base of a substrate;
coupling a mounting surface of a lens housing to a joint surface of a sidewall of said substrate, wherein said substrate is one of a plurality of substrates coupled together in an image sensor substrate; and
singulating said image sensor substrate.

14. The method of claim 13 wherein said mounting surface is coupled to said joint surface by adhesive.

15. The method of claim 13 wherein said mounting surface is coupled to said joint surface by a butt bond.

16. The method of claim 13 wherein said mounting surface comprises a locking feature.

17. The method of claim 13 wherein said joint surface comprises a locking feature.

18. The method of claim 13 wherein said singulating comprises snapping said image sensor substrate.

19. A method comprising:
coupling an image sensor to a base of a substrate;
coupling a mounting surface comprising a locking feature of a lens housing to a joint surface of a sidewall of said substrate comprising:
forming a bond between a first surface of said mounting surface and said joint surface; and
forming a bond between a second surface of said mounting surface and an interior surface of said sidewall.

20. The method of claim 19 wherein said first surface of said mounting surface is parallel to said joint surface and wherein said second surface of said mounting surface is perpendicular to said joint surface.

21. The method of claim 19 wherein said substrate is one of a plurality of substrates coupled together in an image sensor substrate.

22. A method comprising:
coupling an image sensor to a base of a substrate; and
coupling a mounting surface of a lens housing to a joint surface comprising a locking feature of a sidewall of said substrate comprising:
forming a bond between a first surface of said joint surface and said mounting surface; and
forming a bond between a second surface of said joint surface and an exterior side surface of said lens housing.

23. The method of claim 22 wherein said first surface of said joint surface is parallel to said mounting surface and wherein said second surface of said joint surface is perpendicular to said mounting surface.

24. The method of claim 22 wherein said substrate is one of a plurality of substrates coupled together in an image sensor substrate.

25. A method comprising:
coupling an image sensor to a first substrate of an image sensor substrate;
coupling a lens housing to said first substrate; and
snapping said image sensor substrate along a singulation street between a first sidewall of said first substrate and a second sidewall of a second substrate of said image sensor substrate.

26. A method of forming an optical module comprising:
coupling an image sensor to a base of a substrate;
forming a bond between a first surface of a mounting surface of a lens housing and a joint surface of a sidewall of said substrate; and
forming a bond between a second surface of said mounting surface and an interior surface of said sidewall.

27. The method of claim 26 wherein said substrate is one of a plurality of substrates coupled together in an image sensor substrate.

28. A method of forming an
coupling an image sensor to a base of a substrate;
forming a bond between a first surface of a mounting surface of a lens housing and a joint surface of a sidewall of said substrate, said first surface of said mounting surface being parallel to said joint surface; and
forming a bond between a second surface of said mounting surface and an interior surface of said sidewall, said second surface of said mounting surface being perpendicular to said joint surface.

29. The method of claim 28 wherein said substrate is one of a plurality of substrates coupled together in an image sensor substrate.

30. A method of forming an optical module comprising:
coupling an image sensor to a base of a substrate;
forming a bond between a first surface of a joint surface of a sidewall of said substrate and a mounting surface of a lens housing; and
forming a bond between a second surface of said joint surface and an exterior side surface of said lens housing.

31. The method of claim 30 wherein said substrate is one of a plurality of substrates coupled together in an image sensor substrate.

32. A method of forming an optical module comprising:
coupling an image sensor to a base of a substrate;
forming a bond between a first surface of a joint surface of a sidewall of said substrate and a mounting surface of a lens housing, said first surface of said joint surface being parallel to said mounting surface; and forming a bond between a second surface of said joint surface and an exterior side surface of said lens housing, said second surface of said joint surface being perpendicular to said mounting surface.

33. The method of claim 32 wherein said substrate is one of a plurality of substrates coupled together in an image sensor substrate.

34. A method of forming an optical module comprising:
coupling an image sensor to a base of a first substrate of an image sensor substrate;
coupling a lens housing to said first substrate comprising:
forming a bond between a first surface of a mounting surface of said lens housing and a joint surface of a first sidewall of said first substrate; and
forming a bond between a second surface of said mounting surface and an interior surface of said first sidewall; and
snapping said image sensor substrate along a singulation street between said first sidewall of said first substrate and a second sidewall of a second substrate of said image sensor substrate.

* * * * *

UNITED STATES PATENT AND TRADEMARK OFFICE
CERTIFICATE OF CORRECTION

| | | |
|---|---|---|
| PATENT NO. | : 7,059,040 B1 | Page 1 of 1 |
| APPLICATION NO. | : 09/764196 | |
| DATED | : June 13, 2006 | |
| INVENTOR(S) | : Steven Webster, Thomas P. Glenn and Roy Dale Hollaway | |

It is certified that error appears in the above-identified patent and that said Letters Patent is hereby corrected as shown below:

In Claim 28, at Column 16, Line 39, after "A Method of forming an", insert --optical module comprising:--.

Signed and Sealed this

Thirtieth Day of January, 2007

JON W. DUDAS
*Director of the United States Patent and Trademark Office*